(12) United States Patent
Kushida

(10) Patent No.: US 7,200,780 B2
(45) Date of Patent: Apr. 3, 2007

(54) SEMICONDUCTOR MEMORY INCLUDING ERROR CORRECTION FUNCTION

(75) Inventor: Keiichi Kushida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 458 days.

(21) Appl. No.: 10/734,303

(22) Filed: Dec. 15, 2003

(65) Prior Publication Data

US 2005/0036371 A1 Feb. 17, 2005

(30) Foreign Application Priority Data

Aug. 11, 2003 (JP) ............................. 2003-291491

(51) Int. Cl.
*G06F 11/00* (2006.01)
(52) U.S. Cl. .................. 714/52; 714/5; 714/8; 714/42; 714/718; 365/201
(58) Field of Classification Search ................ 714/5, 714/8, 42, 52, 718; 365/201
See application file for complete search history.

(56) References Cited

U.S. PATENT DOCUMENTS 6,119,248 A * 9/2000 Merkin ........................ 714/52
6,216,247 B1 * 4/2001 Creta et al. .................. 714/763

FOREIGN PATENT DOCUMENTS

| JP | 63-167500 | 7/1988 |
|---|---|---|
| JP | 2000-242515 | 9/2000 |

OTHER PUBLICATIONS

U.S. Appl. No. 10/734,303, filed Dec. 15, 2003, Kushida.
U.S. Appl. No. 10/828,282, filed Apr. 21, 2004, Kushida et al.
Kiyohiro Furutani, et al., "A Built-in Hamming Code ECC Circuit for DRAM'S", IEEE Journal of Solid-State Circuits, vol. 24, No. 1, Feb. 1989, pp. 50-56.

* cited by examiner

*Primary Examiner*—Robert Beausoliel
*Assistant Examiner*—Charles Ehne
(74) *Attorney, Agent, or Firm*—Oblon, Spivak, McClelland, Maier & Neustadt, P.C.

(57) ABSTRACT

A semiconductor memory comprises, a data memory having a plurality of memory regions to store data at addresses specified, a code memory having the same address space as the data memory to store error correction codes, an error correction code control circuit including an error correction code generation circuit, a syndrome generation circuit and an error correction code decoding circuit, generating an error correction code for correcting data before the data is written back into the memory region, and comparing the generated error correction code with corresponding error correction code, thereby to determine whether the data is erroneous, and an error correction code function invalidity control circuit invalidating an error correction function of the error correction code control circuit when the memory regions are accessed first after power application.

20 Claims, 4 Drawing Sheets

SEMICONDUCTOR MEMORY INCLUDING ERROR CORRECTION FUNCTION

CROSS-REFERENCE TO RELATED APPLICATIONS

This application is based upon and claims the benefit of priority from the prior Japanese Patent Application No. 2003-291491, filed Aug. 11, 2003, the entire contents of which are incorporated herein by reference.

BACKGROUND OF THE INVENTION

1. Field of the Invention

The present invention relates to a semiconductor memory including an error correction function by use of an error correction code (ECC) and, more particularly, to a semiconductor memory including no resetting functions that are used, for example, in a mass-storage SRAM.

2. Description of the Related Art

With an improvement in fine patterning and storage capacity of a semiconductor memory, manufacturing technologies have been becoming more sophisticated and difficult to implement, thus making it difficult to manufacture at a high yield such a memory product that all memory cells in the memory operate properly. Further, improved fine patterning has reduced a capacitance to be held in each bit cell, thus causing a phenomenon of random destruction of a one-bit error (which is referred to as a soft error) owing to cosmic radiation or alpha radiation to occur frequently to such an extent that it cannot be ignored. This soft error phenomenon cannot be repaired by redundancy technologies and so has been becoming a big problem. As one solution for this problem, a memory has a correction function inside.

FIG. 6 shows part of a DRAM having a conventional error correction function.

This DRAM comprises: an input/output (I/O) circuit 10 for sending input data/output data to and receiving them from an outside of the DRAM; a data memory (main memory) 11 which has a plurality of memory regions to store n-bit data in a specified address; a code memory 12 which has the same address area as the data memory 11 and which stores an m-bit (m<n) code (ECC) which enables correcting each piece of data stored in each of the memory regions of the data memory 11; and an ECC control circuit 13 provided to control these components.

FIG. 7 shows a conventional example of the ECC control circuit 13 of FIG. 6.

This ECC control circuit comprises a read data register 23, an ECC code register 24, an ECC code generation circuit 25, a syndrome generation circuit 26, an ECC decoding circuit (syndrome decoder) 27, and a correction data register 28, thus having the following basic functions.

(1) In data reading before ordinary data writing, n-bit data read from the data memory 11 is stored in read data register 23, while simultaneously an m-bit ECC code read from the code memory 12 is stored in the ECC code register 24. Then, for the data read from the data memory 11, an m-bit ECC code is generated by the ECC code generation circuit 25. The generated ECC code is compared to the ECC code read from the code memory 12 by the syndrome generation circuit 26, thereby generating an error correction code, which is referred to as a syndrome. If, in this case, the two ECC codes agree, the syndrome code is "0", and if a specific one bit in the read data or the ECC code has been inverted, the syndrome code takes on a value other than "0".

If the syndrome code is "0", the ECC decoding circuit (syndrome decoder) 27 decides that the inputted data has been saved properly. If the syndrome code is a specific value other than "0", on the other hand, it can be decided which bit is not correct because the syndrome code is in one-to-one correspondence with an inversed bit and so corrects it.

Subsequently, in data writing, for input data to be written in the data memory 11 from the I/O circuit 10, an ECC code is generated by the ECC code generation circuit 25. Then, this ECC code is stored in the code memory 12.

(2) In ordinary data reading, the same operation as in the above described data reading before ordinary data writing is performed. In this case, data stored in the read data register 23 passes through the correction data resister 28 as it is or is corrected one bit in the correction data resister 28, to provide output data.

As described above, a DRAM including the ECC function is capable of correcting a data error of up to one bit for each data in each address and outputting it, thus enabling suppressing a data error rate due to a soft error that cannot be repaired. Furthermore, it also has an effect of repairing bit failures that may occur in a process, if the failure rates are reasonably low.

It is to be noted that, for example, generally an SRAM does not include the resetting function for a reason in specifications. In a case where the ECC control circuit 13 such as shown in FIG. 6 is incorporated in such a memory, immediately after power application, a relationship between data in the read data memory 11 and ECC codes in the code memory 12 are in a random condition (in a condition where there is no correlation about the ECC code), so that the ECC function does not operate properly.

Further, in a case where the ECC control circuit having an ECC function dedicated as a one-bit correction function generally used often is incorporated in the SRAM, immediately after power application, it cannot be accommodated if a data error of at least two bits has occurred in the data in the data memory 11 and the ECC code in the code memory 12. In such a case, when data reading is performed to the data memory 11 and the code memory 12 for the first time after power application, an originally error-free one bit in the data read from the data memory 11 is corrected mistakenly at a high probability.

That is, if an ECC code generated for data read from the data memory 11 and an ECC code read from the code memory 12 are compared to each other to thereby create a syndrome code, the syndrome code takes on a specific value other than "0", so that one bit of the originally correct data may possibly be corrected mistakenly, which is a problem.

The following will consider a case where a bit width n of the data memory 11 is set larger than a bit width of input/output data of the I/O circuit 10 or such a function (mask function) is provided as to write only some bits of input data in the data memory 11. In this case, in order to create an ECC code in first data writing after power application, data needs to be read from the data memory beforehand and referred to, so that it is difficult to avoid the above mistaken correction problem, resulting in writing back an incorrect ECC code.

Furthermore, if the ECC control circuit 13 is applied to take measures not only against a soft error but also against a fixed bit failure, this problem is fatal. That is, if a fixed single-bit failure is present in a memory region having an address specified when data is written first after power application, when data is read next, a total of two bits of this failed bit and a mistakenly corrected bit are decided to be failed, so that this read data is read as incorrect data at a high probability.

Jpn. Pat. Appln. KOKAI Publication No. 2000-242515 discloses a method by which, to verify a function of the ECC control circuit, a bit position where a one-bit error has been generated and a bit position where a one-bit error has been detected by the ECC control circuit from outputs of two selectors are compared to each other, so that a data value before the occurrence of the one-bit error and a data value after correction of the one-bit error by the ECC control circuit are compared to each other.

BRIEF SUMMARY OF THE INVENTION

A semiconductor memory according to one aspect of the present invention comprises; a data memory having a plurality of memory regions to store data at addresses specified; a code memory having the same address space as the data memory to store error correction codes for correcting each pieces of data that are stored in the memory regions of the data memory; an error correction code control circuit including an error correction code generation circuit, a syndrome generation circuit and an error correction code decoding circuit, generating an error correction code for correcting data read from any memory region of the data memory before the data is written back into the memory region, and comparing the generated error correction code with an error correction code read from the code memory corresponding to the memory region, thereby to determine whether the data is erroneous and to correct the data when the data is erroneous; and an error correction code function invalidity control circuit invalidating an error correction function of the error correction code control circuit for pieces of data read from the memory regions of the data memory when the memory regions are accessed first after power application.

A semiconductor memory according to one aspect of the present invention comprises; a data memory having a plurality of memory regions to store data at addresses specified; a code memory having the same address space as the data memory to store error correction codes for correcting each pieces of data that are stored in the memory regions of the data memory; an error correction code control circuit including an error correction code generation circuit, a syndrome generation circuit and an error correction code decoding circuit, generating an error correction code for correcting data read from any memory region of the data memory before the data is written back into the memory region, and comparing the generated error correction code with an error correction code read from the code memory corresponding to the memory region, thereby to determine whether the data is erroneous and to correct the data when the data is erroneous; an error correction code function invalidity control circuit invalidating an error correction function of the error correction code control circuit for pieces of data read from the memory regions of the data memory when the memory regions are accessed first after power application; and a group of memory circuit being configured independently of the data memory to store valid bits corresponding to the memory regions of the data memory, being accessed simultaneously with the corresponding memory regions so that the valid bits stored are initialized by a resetting signal after power application, wherein the error correction code function invalidity control circuit outputs a signal to stop the syndrome generation circuit when data is read from any memory region of the data memory, if the data stored in the memory cell corresponding to the memory region is an initial value; and the error correction code control circuit rewrites a valid bit to valid state in the memory cell corresponding to the memory region when data is first read from the memory region of the data memory after power application.

A semiconductor memory according to another aspect of the present invention comprises; a data memory having a plurality of memory regions to store data at addresses specified; a code memory having the same address space as the data memory to store error correction codes for correcting each pieces of data that are stored in the memory regions of the data memory; an error correction code control circuit including an error correction code generation circuit, a syndrome generation circuit and an error correction code decoding circuit, generating an error correction code for correcting data read from any memory region of the data memory before the data is written back into the memory region, and comparing the generated error correction code with an error correction code read from the code memory corresponding to the memory region, thereby to determine whether the data is erroneous and to correct the data when the data is erroneous; and a built-in self test circuit including a self-test function, a data memory initialization function and an error correction code function invalidity control function and being connected to a syndrome generation circuit and an error correction code decoding circuit in an error correction code control circuit to realize the error correction code function invalidity control function, wherein the error correction code function invalidity control function of the built-in self test circuit invalidates an error correction function on the data read from the memory regions controlled by the error correction code control circuit when the memory regions of the data memory are accessed first after power application.

DETAILED DESCRIPTION OF THE INVENTION

The following will describe embodiments of the present invention with reference to drawings. In this description, common components are indicated by the same reference symbols in all of the drawings.

<First Embodiment>

Figure 1:
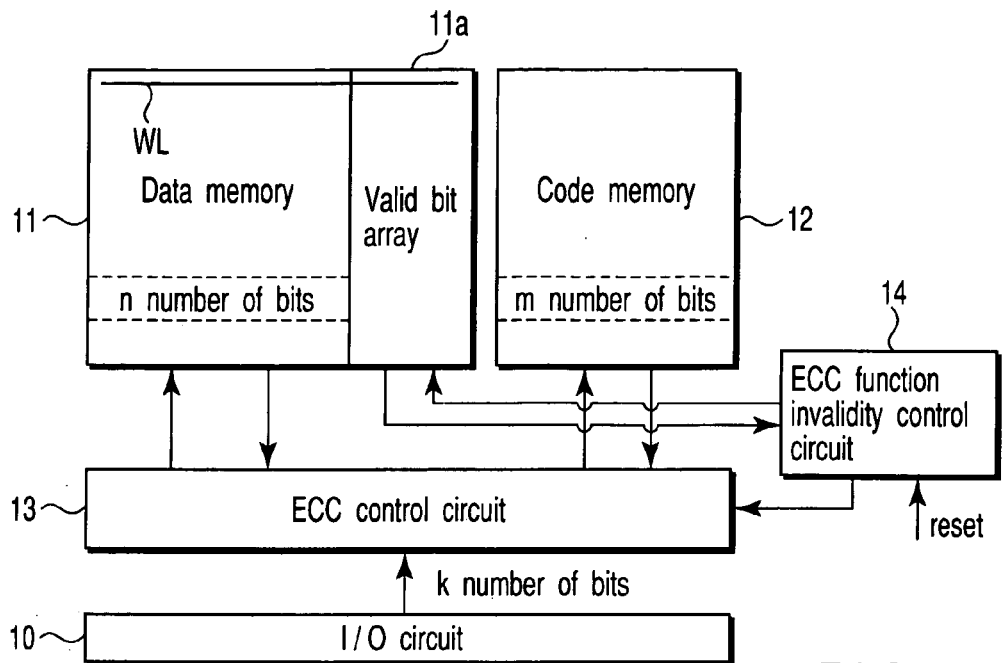
FIG. 1 is a block diagram for showing part of an SRAM according to a first embodiment of the present invention.

FIG. 1 shows part of an SRAM according to the first embodiment of the present invention.

This SRAM comprises: an input/output (I/O) circuit 10 for sending k-bit input data/output data to and receiving them from an outside of the SRAM; a data memory (main memory) 11 which has a plurality of memory regions each of which has an n-bit data width (e.g., n is an integral multiple of k); a code memory 12 that has the same address area as the data memory 11 and which stores an m-bit ECC code (m<n) capable of correcting each piece of data stored in each of the memory regions of the data memory 11; and an ECC control circuit 13 provided to control these components.

Figure 2:
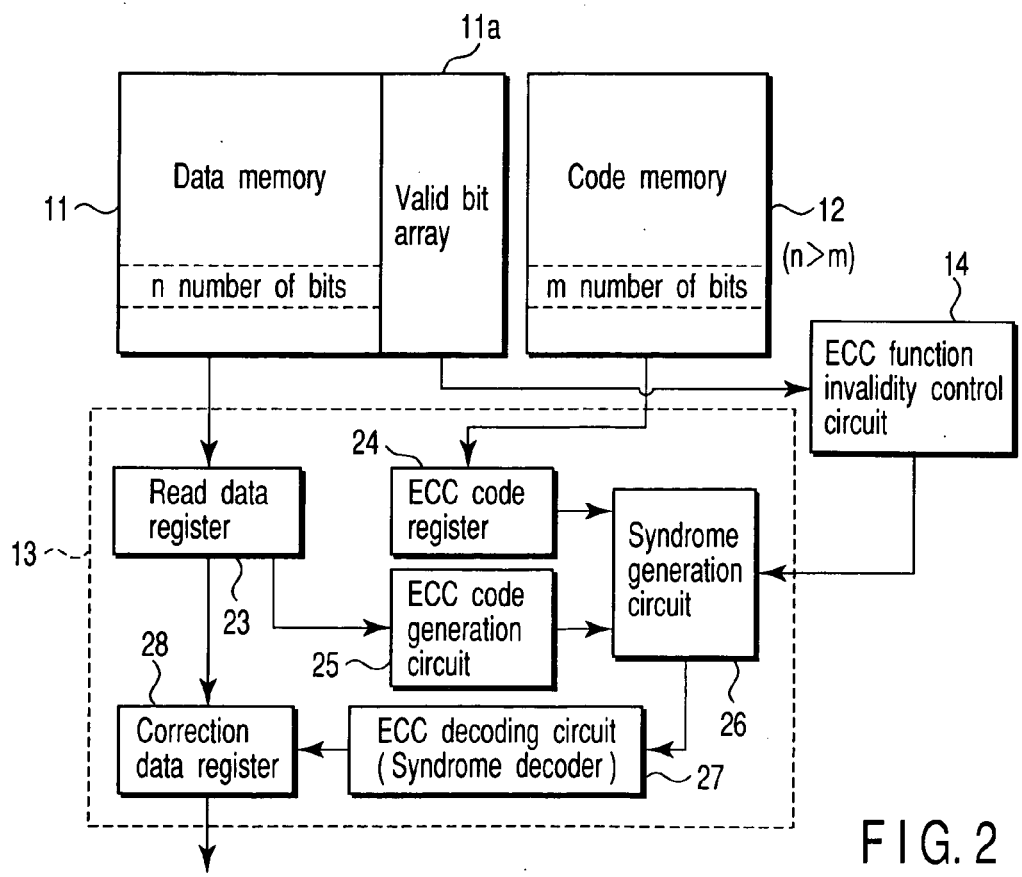
FIG. 2 is a block diagram for showing one example of an ECC control circuit of FIG. 1.
Figure 7:
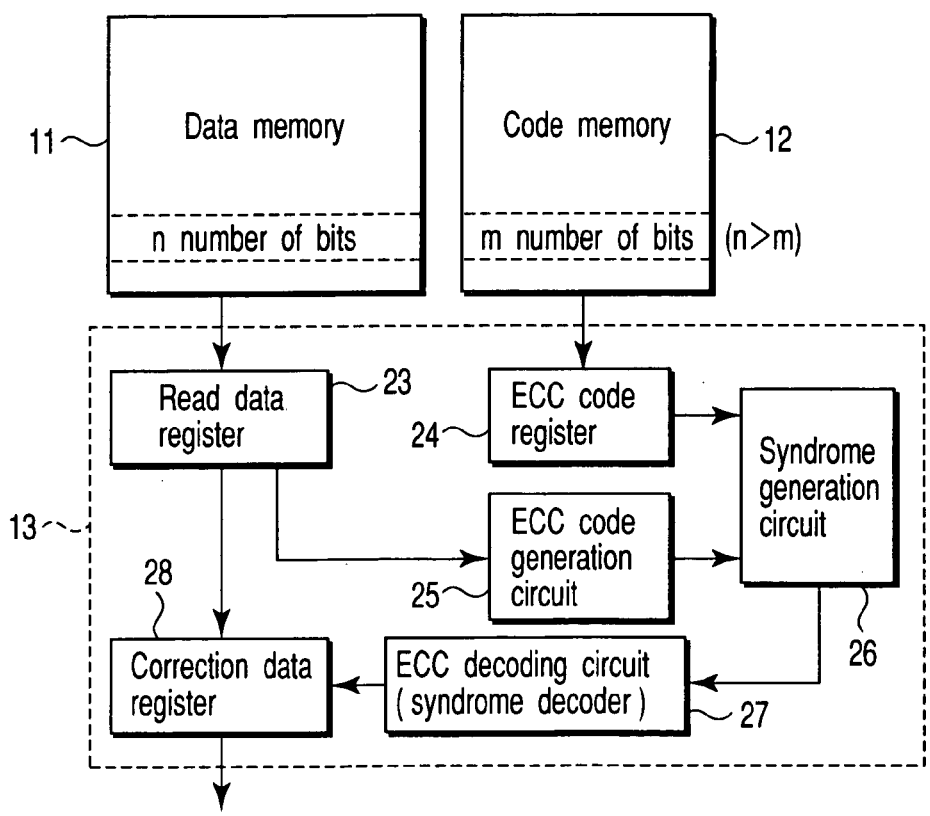
FIG. 7 is a block diagram for showing a conventional example of the ECC control circuit of FIG. 6.

The ECC control circuit 13 includes, as shown in FIG. 2 for example, a read data register 23, an ECC code register 24, an ECC code generation circuit 25, a syndrome generation circuit 26, an ECC decoding circuit (syndrome decoder) 27, and a correction data register 28. It also includes the same basic functions (1) and (2) as those of the conventional ECC control circuit 13 described above with reference to FIG. 7, and (3) further it can provide control so that error correction may not be conducted for data read from the memory in first data reading after power application, as a function.

That is, the ECC control circuit 13 has the following functions.

(1) In data reading before ordinary data writing, it stores n-bit data read from the memory of the data memory 11 in the data register 23 and, at the same time, stores an m-bit ECC code read from the code memory 12 in the ECC code register 24. Then, for the data read from the memory, it generates an m-bit ECC code using the ECC code generation circuit 25 and compares the ECC code to the ECC code read from the code memory 12 using the syndrome generation circuit 26 to create an error correction code referred to as a syndrome. If these two ECC codes agree, the syndrome code is "0"; if a specific one bit of the read data or ECC code has been inverted, the syndrome code takes on a specific value other than "0".

The ECC decoding circuit (syndrome decoder) 27 decides that data has been saved properly in data input operation if the syndrome code is "0". If the syndrome code is a specific value other than "0", on the other hand, it can decide which bit is not correct because the syndrome code is in one-to-one correlation with an inversed bit and so corrects it.

Subsequently, in data writing, for k-bit input data to be written in the data memory 11 from the I/O circuit 10, it generates an ECC code using the ECC code generation circuit 25. Then, it stores this ECC code in the code memory 12.

(2) In ordinary data reading, the same operation as in the above data reading before ordinary data writing is performed. In this case, data stored in the read data register 23 passes through the correction data register 28 as it is or is corrected one bit at the correction data register 28, to provide output data.

(3) In first data reading after power application, it provides control so that error correction may not be conducted for data read from the memory region of the data memory 11. In a specific example, for n-bit data read from this memory region, it generates an m-bit ECC code using the ECC code generation circuit 25. And it conducts control so that this ECC code and the ECC code read from the code memory 12 may not be compared to each other at the syndrome generation circuit 26 or a result of comparison, even if performed at the syndrome generation circuit 26, may be invalidated.

Further, it includes: an ECC function invalidity control circuit 14 for controlling validity/invalidity of the error correction function for data read from the data memory 11 to the read data register 23 (in this example, it controls validity/invalidity of the syndrome generation circuit 26); and a valid bit array 11a constituted of a group of memory cells which are added to store a valid bit corresponding to each of the memory regions of the data memory 11 so that initial data in the data memory 11 and that in the code memory 12 may match each other.

The ECC function invalidity control circuit 14 has (1) a function to initialize into an invalid state ("1" state or flag-ON state in this example) a valid bit in each of the memory cells of the valid bit array 11a by using a resetting signal after power application, (2) a function to output a signal for stopping operation of the syndrome generation circuit when data is read from any of the memory regions of the data memory 11 and if a valid bit corresponding to the memory region has an initial value, in other words, a function to invalidate functions of the syndrome generation circuit of the ECC control circuit 13 when any of the memory regions of the data memory 11 is accessed first after power application, and (3) after data is read from any of the memory regions of the data memory 11 first after power application, a function to rewrite a valid bit corresponding to this memory region into a valid state ("0" state or flag-OFF state in this example).

Figure 3:
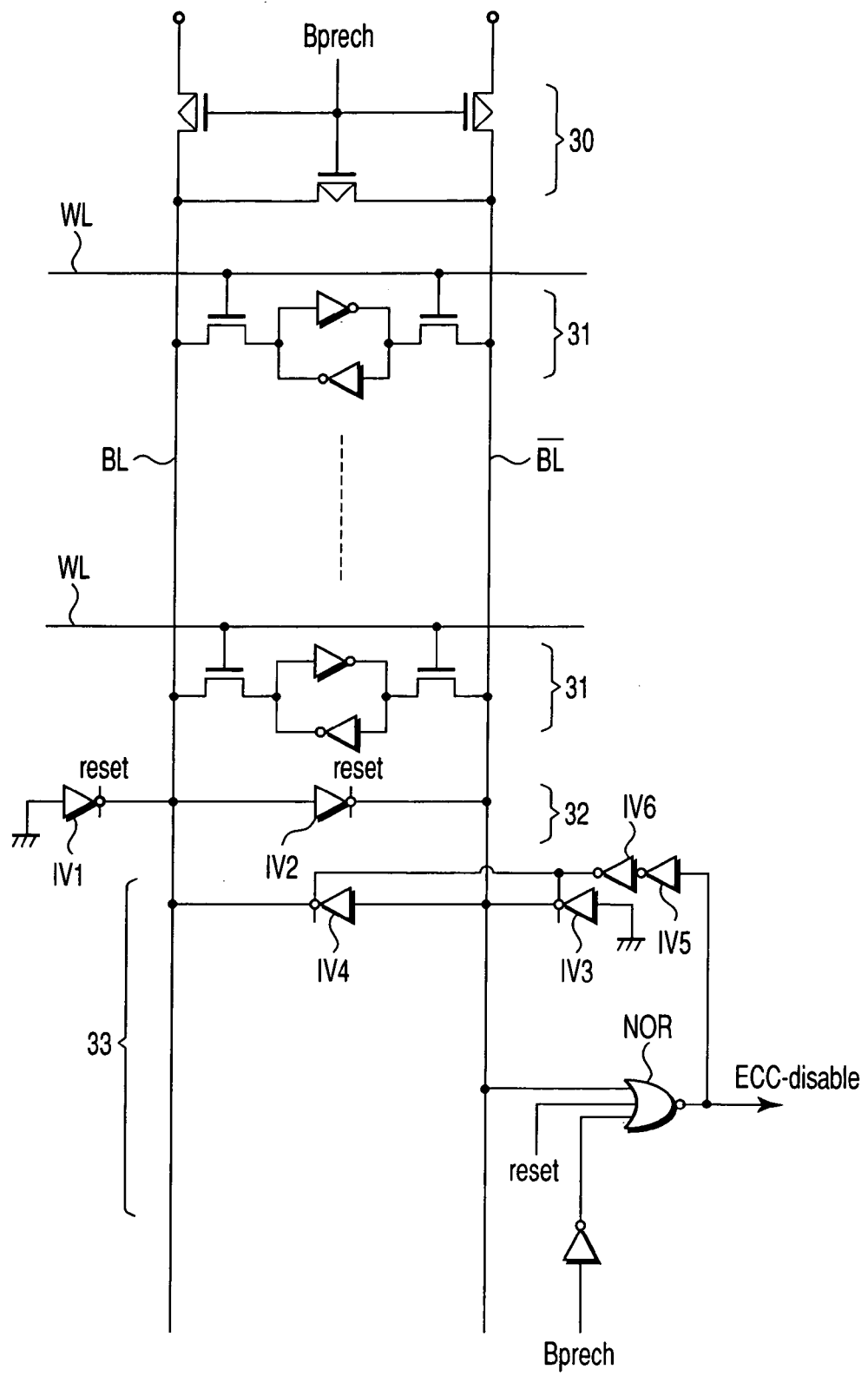
FIG. 3 is a circuit diagram for showing one example of a column of a valid bit array added to a data memory of FIG. 1.

FIG. 3 shows one example of a column of the valid bit array 11a added to the data memory of FIG. 1.

To one pair of bit lines BL and /BL of a column of the valid bit array 11a are connected to a bit line pre-charge/ equalization circuit 30, a plurality of memory cells 31, and an initialization circuit 32. The memory cells 31 each have the same configuration as that of each of the memory cells (SRAM cells) of the data memory 11 and, therefore, are connected to a word line common to the other memory cells in the same row or to a word line WL selected and driven in the same manner as a word line of the other memory cells in the same row.

The initialization circuit 32 is constituted of a first clocked inverter circuit IV1 connected between a ground node and one of the bit lines (first bit line) BL and a second clocked inverter circuit IV2 connected between the above one pair of bit lines BL and /BL, in which these two clocked inverter circuits IV1 and IV2 are driven by a resetting pulse signal, reset.

The one pair of bit lines BL and /BL is further connected to an initialization releasing circuit 33. This initialization releasing circuit 33 is constituted of a third clocked inverter circuit IV3 connected between the ground node and the other bit line (second bit line)/BL, a fourth clocked inverter circuit IV4 connected between the one pair of bit lines BL and /BL, a NOR circuit NOR for taking a negated logical sum of three inputs of a bit line precharge signal, Bprech, a potential of the second bit line /BL, and the resetting pulse signal, reset, and inverter circuits IV5 and IV6 which are connected in two stages for buffering and amplifying an output signal (ECC function stop signal: ECC-disable) of this NOR circuit NOR to thereby drive the third and fourth clocked inverters IV3 and IV4.

According to a configuration of FIG. 3, after power application, for example, the power-ON reset signal, reset, drives the two clocked inverter circuits IV3 and IV4 of the initialization releasing circuit 33, to set the first bit line BL to an "H" level and the second bit line /BL to an "L" level, that is, the valid bit is initialized into the "1" state (flag-ON state).

In such a reset state, when the bit line pre-charge signal Bprech is activated in first data reading, the output signal ECC-disable of the NOR circuit NOR becomes the "H"

level to stop operation of the syndrome generation circuit 26 in the ECC control circuit 13.

Then, when the bit line pre-charge signal is deactivated, the output signal ECC-disable of the NOR circuit NOR becomes the "L" level, which enables the syndrome generation circuit 26 of the ECC control circuit 13 to operate and also drives the two clocked inverter circuits IV3 and IV4 of the initialization circuit 22, so that the second bit line /BL becomes the "H" level and the first bit line BL becomes the "L" level, that is, the valid bit is put into the "0" state, thereby releasing the initial state.

The following will simply describe an overall flow of operation of the SRAM according to the first embodiment described above.

After power application, the power-ON resetting signal initializes the valid bit of the valid bit array 11*a* to the "1" state.

Next, to write data in a specified address of the data memory 11, first, data stored in a memory region of the specified address and a valid bit are read and stored in the read data register 23. Simultaneously, an m-bit ECC code read from the code memory 12 is stored in the ECC code register 24.

At time of such first data reading after power application, the valid bit is "1", so that the syndrome generation circuit 26 stops being operative and so does not correct the data read from the memory region.

Next, write data is written in the memory region of the specified address, so that an ECC code created for data partially overwritten with the write data is written in the code memory 12. Simultaneously with this data writing, a valid bit corresponding to the memory region of the specified address is rewritten to "0".

At time of the second data reading or the subsequent, the valid bit is "0", so that the syndrome generation circuit 26 operates ordinarily, to correct read data properly by using an ECC code corresponding to data stored in a memory region of a specified address.

According to the above SRAM of the first embodiment, even if data which is stored in the read data memory 11 and an ECC code of the code memory 12 do not correspond to each other, the data is not corrected mistakenly by the syndrome generation circuit 26 when it is read initially.

It is thus possible to correct data properly against, especially, a soft error. Furthermore, the ECC function can be utilized to properly correct also a fixed single-bit failure caused by a process.

Further, the present embodiment provides an advantage that a lapse of time required for the read data memory 11 to become accessible first after power application is reduced in a case where a valid bit of the valid bit array 11*a* is initialized by the power-ON resetting signal generated after power application.

<Modification of First Embodiment>

Figure 4:
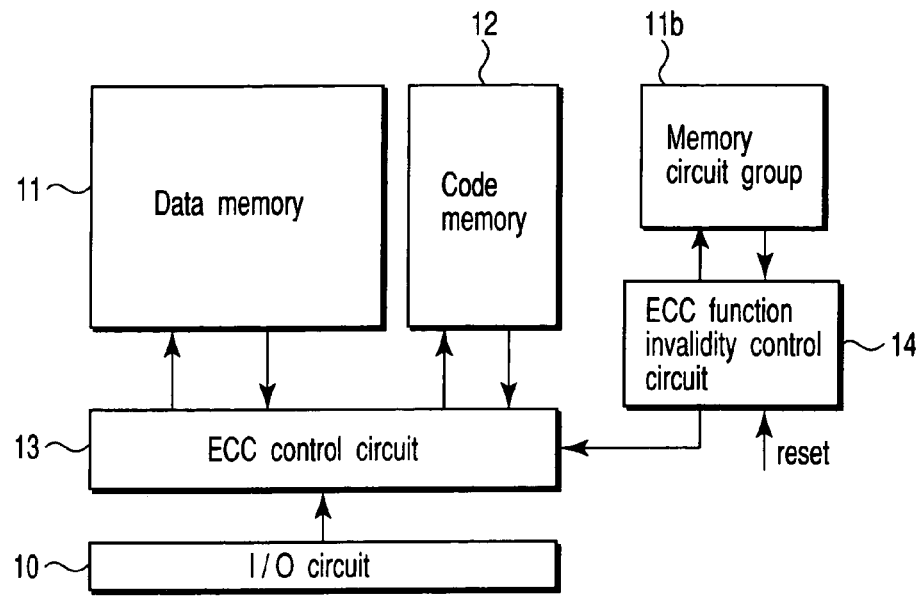
FIG. 4 is a block diagram for showing part of a variant of the SRAM according to the first embodiment.

Although in the first embodiment the valid bit array 11*a* has been added to the read data memory 11, the present invention is not limited to it; for example, as shown in FIG. 4, a valid bit memory circuit group (e.g., flip-flop circuit group) 11*b* similar to the valid bit array 11*a* may be disposed independently of the read data memory 11. It is to be noted that, in FIGS. 1 and 4, the same components are indicated by the same reference symbols.

In such a modification, an ECC function invalidity control circuit 14 simultaneously accesses a memory region of the read data memory 11 and a valid bit memory circuit corresponding to it, to initialize a valid bit by using a resetting signal, reset, after power application. If a valid bit corresponding to any of memory regions of the read data memory 11 from which data has been read has an initial value, a signal is output which stops operation of a syndrome generation circuit (which is indicated by a reference numeral 26 in FIG. 2) in an ECC control circuit 13. Further, when data is read from any of the memory regions of the read data memory 11 first after power application, control is conducted so that a valid bit corresponding to the memory region may be rewritten into a valid state.

Therefore, in a case where each of the memory regions of the read data memory 11 is accessed first after power application, it is possible to invalidate an error correction function for data read from each of the memory regions, thus enabling providing the same effects as those by the first embodiment.

<Second Embodiment>

Figure 5:
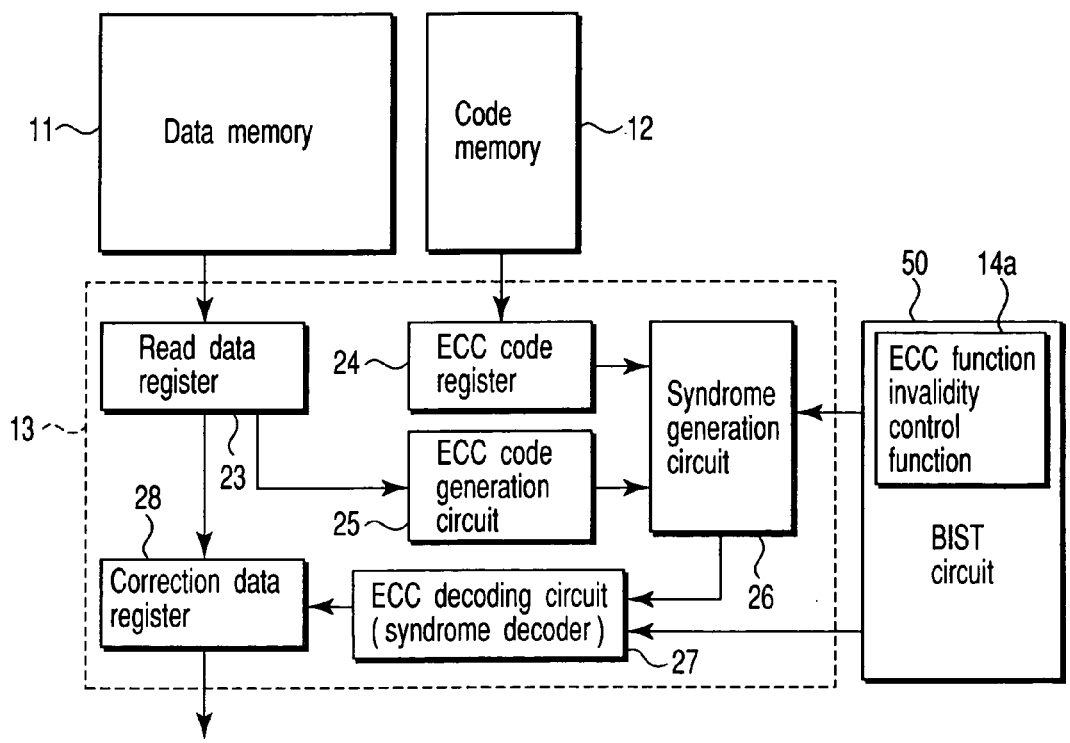
FIG. 5 is a block diagram for showing part of an SRAM according to a second embodiment of the present invention.
Figure 6:
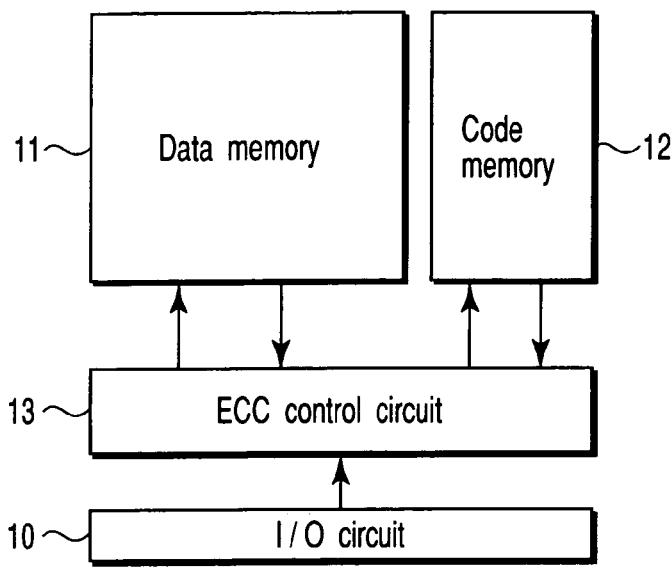
FIG. 6 is a block diagram for showing part of a DRAM including a conventional error correction function.

FIG. 5 shows part of an SRAM according to the second embodiment of the present invention.

This SRAM includes an I/O circuit 10, a read data memory 11, a code memory 12, and an ECC control circuit 13 that are the same as those of an SRAM shown in FIG. 1 as well as a built-in self-test (BIST) circuit 50.

This BIST circuit 50 has an ordinary BIST function as well as a read data memory initialization function and an ECC function invalidity control function 14*a* and is connected to a syndrome generation circuit 26 and an ECC decoding circuit 27 that are included in the ECC control circuit 13, to realize the ECC function invalidity control function 14*a*.

That is, immediately after power application, the BIST circuit 50 automatically generates an address corresponding to each of the memory regions of the read data memory 11, initial data, and its code data and outputs a signal for stopping functions of the syndrome generation circuit 26 when these address, initial data, and code data are written by the ECC control circuit 13 in the read data memory 11 and the code memory 12.

In this way, even in a case where the BIST circuit 50 having the read data memory initialization function and the ECC function invalidity control function 14*a* is used, when access is made to each of the memory regions of the read data memory 11 first after power application, an error correction function for data which has been read can be invalidated, thus providing the same effects as those by the first embodiment.

Further, as compared to a case where the valid bit array 11*a* or the valid bit memory circuit group 11*b* is added as in the case of the first embodiment, by the second embodiment a circuit scale can be made small by adding the ECC function invalidity control function 14*a* to the existing BIST circuit which is included in a semiconductor memory.

<Modification of Second Embodiment>

The BIST circuit 50 in the second embodiment may be modified into a BIST circuit including an initial memory test function (e.g., march test, i.e., test by consecutive writing and reading). This BIST circuit including the initial memory test function writes test pattern data prepared beforehand in each of memory regions of a read data memory 11 using an ECC control circuit 13 immediately after power application. In this case, it outputs a signal which stops functions of a syndrome generation circuit 26, to generate an ECC code by passing the test pattern data through an ECC code generation circuit 25 and write it into a code memory 12.

In this way, even in a case where the BIST circuit having the initial memory test function is included, when access is made to each of the memory regions of the read data memory 11 first after power application, an error correction function of the ECC control circuit 13 for data which has been read from each of the memory regions can be invalidated, thus providing the same effects as those by the second embodiment.

According to a semiconductor memory of the present embodiment, in initial reading of data after power application, it is possible to prevent data from being corrected mistakenly by the syndrome generation circuit in the ECC control circuit, thus correcting the data properly against a soft error.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
    a data memory having a plurality of memory regions to store data at addresses specified;
    a code memory having the same address space as the data memory to store error correction codes for correcting each piece of data that is stored in the memory regions of the data memory;
    an error correction code control circuit including an error correction code generation circuit, a syndrome generation circuit and an error correction code decoding circuit, generating an error correction code for correcting data read from any memory region of the data memory before the data is written back into the memory region, and comparing the generated error correction code with an error correction code read from the code memory corresponding to the memory region, thereby to determine whether the data is erroneous and to correct the data when the data is erroneous; and
    an error correction code function invalidity control circuit connected to the error correction code control circuit and a valid bit array, initializing into an invalid state a valid bit in each of memory cells of the valid bit array after power application, and invalidating an error correction function of the error correction code control circuit on pieces of data read from the memory regions of the data memory when the memory regions are accessed first after power application.

2. The semiconductor memory according to claim 1, further comprising a memory cell array being accessed simultaneously with the memory regions to store valid bits corresponding to the memory regions of the data memory, and in which valid bits are initialized into invalid state by a reset signal after power application,
    wherein the error correction code function invalidity control circuit outputs a signal to stop the syndrome generation circuit when data is read from any memory region of the data memory, if the data stored in the memory cell corresponding to the memory region is an initial value; and
    the error correction code control circuit controls to rewrite a valid bit into valid state in the memory cell corresponding to the memory region when data is first read from the memory region of the data memory after power application.

3. The semiconductor memory according to claim 2, wherein the memory cell array is added to the data memory.

4. The semiconductor memory according to claim 2, wherein the memory cell array comprises an initialization circuit connected to a pair of bit lines and a plurality of memory cells connected to word lines and the pair of bit lines, the word lines being connected commonly with the corresponding memory cells of the memory regions.

5. The semiconductor memory according to claim 3, wherein the memory cell array comprises an initialization circuit connected to a pair of bit lines and a plurality of memory cells connected to word lines and the pair of bit lines, the word lines being connected commonly with the corresponding memory cells of the memory regions.

6. The semiconductor memory according to claim 4, wherein each of the memory cells of the memory cell array is selectively controlled by a word line commonly connected with each of corresponding memory cells of the data memory.

7. The semiconductor memory according to claim 5, wherein each of the memory cells of the memory cell array is selectively controlled by a word line commonly connected with each of the corresponding memory cells of the data memory.

8. The semiconductor memory according to claim 1, wherein the error correction code function invalidity control circuit automatically generates addresses corresponding to the memory regions of the data memory, pieces of initial data and pieces of code data corresponding to the pieces of initial data, and stops function of the error correction code control circuit immediately after power application before the error correction code control circuit writes the pieces of initial data into the corresponding memory regions of the data memory, and the pieces of code data into the corresponding code memory, respectively.

9. The semiconductor memory according to claim 2, wherein the error correction code function invalidity control circuit automatically generates addresses corresponding to the memory regions of the data memory, pieces of initial data and pieces of code data corresponding to the pieces of initial data, and stops function of the error correction code control circuit immediately after power application before the error correction code control circuit writes the pieces of initial data into the corresponding memory regions of the data memory, and the pieces of code data into the corresponding code memory, respectively.

10. The semiconductor memory according to claim 3, wherein the error correction code function invalidity control circuit automatically generates addresses corresponding to the memory regions of the data memory, pieces of initial data and pieces of code data corresponding to the pieces of initial data, and stops function of the error correction code control circuit immediately after power application before the error correction code control circuit writes the pieces of initial data into the corresponding memory regions of the data memory, and the pieces of code data into the corresponding code memory, respectively.

11. The semiconductor memory according to claim 1, wherein the error correction code function invalidity control circuit outputs a signal to stop the error correction code control circuit immediately after power application before the error correction code control circuit writes test pattern data into the memory regions of the data memory and the code data of the pattern data into the code memory.

12. The semiconductor memory according to claim 11, wherein the error correction code function invalidity control circuit is incorporated as part of a built-in self test circuit for use in initial testing.

13. A semiconductor memory comprising:
a data memory having a plurality of memory regions to store data at addresses specified;
a code memory having the same address space as the data memory to store error correction codes for correcting each piece of data that is stored in the memory regions of the data memory;
an error correction code control circuit including an error correction code generation circuit, a syndrome generation circuit and an error correction code decoding circuit, generating an error correction code for correcting data read from any memory region of the data memory before the data is written back into the memory region, and comparing the generated error correction code with an error correction code read from the code memory corresponding to the memory region, thereby to determine whether the data is erroneous and to correct the data when the data is erroneous;
an error correction code function invalidity control circuit invalidating an error correction function of the error correction code control circuit on pieces of data read from the memory regions of the data memory when the memory regions are accessed first after power application; and
a group of memory circuits being configured independently of the data memory, storing valid bits corresponding to the memory regions of the data memory, and being accessed simultaneously with the corresponding memory regions to initialize the valid bits into an invalid state by a resetting signal after power application,
wherein the error correction code function invalidity control circuit outputs a signal to stop the syndrome generation circuit when data is read from any memory region of the data memory, if the data stored in the memory cell corresponding to the memory region is an initial value, and
the error correction code control circuit controls to rewrite a valid bit into a valid state in the memory cell corresponding to the memory region when data is first read from the memory region of the data memory after power application.

14. The semiconductor memory according to claim 13, wherein the memory cell array comprises an initialization circuit connected to a pair of bit lines and a plurality of memory cells connected to word lines and the pair of bit lines, the word lines connecting the corresponding memory cells in the data memory and the memory cell array.

15. The semiconductor memory according to claim 14, wherein each of the memory cells of the memory cell array is selectively controlled by a word line commonly connected with each of the corresponding memory cells of the data memory.

16. The semiconductor memory according to claim 13, wherein the error correction code function invalidity control circuit automatically generates addresses corresponding to the memory regions of the data memory, pieces of initial data and pieces of code data corresponding to the pieces of initial data, and stops function of the error correction code control circuit immediately after power application before the error correction code control circuit writes the pieces of initial data into the corresponding memory regions of the data memory, and the pieces of code data into the corresponding code memory, respectively.

17. The semiconductor memory according to claim 14, wherein the error correction code function invalidity control circuit automatically generates addresses corresponding to the memory regions of the data memory, pieces of initial data and pieces of code data corresponding to the pieces of initial data, and stops function of the error correction code control circuit immediately after power application before the error correction code control circuit writes the pieces of initial data into the corresponding memory regions of the data memory, and the pieces of code data into the corresponding code memory, respectively.

18. The semiconductor memory according to claim 13, the error correction code function invalidity control circuit outputs a signal to stop the error correction code control circuit immediately after power application before the error correction code control circuit writes test pattern data into the memory regions of the data memory and the code data of the pattern data into the code memory.

19. The semiconductor memory according to claim 13, wherein the error correction code function invalidity control circuit is incorporated as part of a built-in self test circuit for use in initial testing.

20. A semiconductor memory comprising:
a data memory having a plurality of memory regions to store data at addresses specified;
a code memory having the same address space as the data memory to store error correction codes for correcting each piece of data that is stored in the memory regions of the data memory;
an error correction code control circuit including an error correction code generation circuit, a syndrome generation circuit and an error correction code decoding circuit, generating an error correction code for correcting data read from any memory region of the data memory before the data is written back into the memory region, and comparing the generated error correction code with an error correction code read from the code memory corresponding to the memory region, thereby to determine whether the data is erroneous and to correct the data when the data is erroneous; and
a built-in self test circuit including a self-test function, a data memory initialization function and an error correction code function invalidity control function and being connected to a syndrome generation circuit and an error correction code decoding circuit in an error correction code control circuit to realize the error correction code function invalidity control function,
wherein the error correction code function invalidity control function of the built-in self test circuit invalidates an error correction function on the data read from the memory regions controlled by the error correction code control circuit when the memory regions of the data memory are accessed first after power application.

* * * * *